United States Patent
Yeh et al.

(10) Patent No.: US 12,068,018 B2
(45) Date of Patent: Aug. 20, 2024

(54) POWER MODE WAKE-UP FOR MEMORY ON DIFFERENT POWER DOMAINS

(71) Applicant: Taiwan Semiconductor Manufacturing Company, Ltd., Hsinchu (TW)

(72) Inventors: Che-Ju Yeh, Kaoshiung (TW); Hau-Tai Shieh, Hsinchu (TW); Yi-Tzu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/230,461

(22) Filed: Aug. 4, 2023

(65) Prior Publication Data
US 2023/0395122 A1    Dec. 7, 2023

Related U.S. Application Data

(63) Continuation of application No. 17/824,260, filed on May 25, 2022, now Pat. No. 11,763,873, which is a continuation of application No. 17/103,294, filed on Nov. 24, 2020, now Pat. No. 11,361,810.

(60) Provisional application No. 62/967,966, filed on Jan. 30, 2020.

(51) Int. Cl.
*G11C 11/4072*    (2006.01)
*G11C 5/06*    (2006.01)
*G11C 5/14*    (2006.01)
*G11C 11/4074*    (2006.01)

(52) U.S. Cl.
CPC ............ *G11C 11/4072* (2013.01); *G11C 5/06* (2013.01); *G11C 5/14* (2013.01); *G11C 11/4074* (2013.01)

(58) Field of Classification Search
CPC ... G11C 11/4072; G11C 11/4074; G11C 5/06; G11C 5/11
See application file for complete search history.

(56) References Cited

U.S. PATENT DOCUMENTS

| | | |
|---|---|---|
| 5,814,851 A | 9/1998 | Suh |
| 7,414,911 B2 | 8/2008 | Choi et al. |
| 8,020,017 B2 | 9/2011 | Padhye et al. |
| 9,013,908 B2 | 4/2015 | Chang et al. |
| 9,026,808 B2 | 5/2015 | Yang et al. |
| 9,083,342 B2 * | 7/2015 | Huang ............. G06F 1/3287 |
| 9,880,596 B2 | 1/2018 | Cheng et al. |

(Continued)

FOREIGN PATENT DOCUMENTS

| | | |
|---|---|---|
| TW | I276277 B | 3/2007 |
| TW | I342026 B | 5/2011 |

OTHER PUBLICATIONS

Taiwan Office Action for Application No. 110102746 mailed Apr. 26, 2023.

*Primary Examiner* — Son L Mai
(74) *Attorney, Agent, or Firm* — Merchant & Gould P.C.

(57) ABSTRACT

A memory device includes an array of memory cells and a plurality of peripheral circuits operably coupled to the memory array. A power control circuit may be configured to individually control an application of power to each of the plurality of peripheral circuits and the array of memory cells. Inserting a switch device across the different power domains to achieve the same sequential wake-up path for the peripheral circuits connected to different power domains reduces peak current.

20 Claims, 4 Drawing Sheets

(56) References Cited

U.S. PATENT DOCUMENTS

| | | |
|---|---|---|
| 10,803,928 B2 | 10/2020 | Sinangil et al. |
| 11,133,039 B2 * | 9/2021 | Yang ..................... G11C 5/148 |
| 2021/0241811 A1 | 8/2021 | Yeh et al. |

* cited by examiner

POWER MODE WAKE-UP FOR MEMORY ON DIFFERENT POWER DOMAINS

CROSS-REFERENCE TO RELATED APPLICATIONS

This application is a continuation of U.S. patent application Ser. No. 17/824,260, filed on May 25, 2022, which is a continuation of U.S. patent application Ser. No. 17/103,294, filed on Nov. 24, 2020, now U.S. Pat. No. 11,361,810 which claims the benefit of U.S. Provisional Patent Application No. 62/967,966, filed on Jan. 30, 2020, the entire contents of which are incorporated by reference.

BACKGROUND

Static random-access memory (SRAM) is a type of semiconductor memory that uses bi-stable latching circuitry to store each bit in a memory array. SRAM maintains data in the memory array without the need to be refreshed when powered, but is still volatile such that data is eventually lost when the memory is not powered. Power gating and voltage retention techniques are commonly implemented to the memory array to reduce power consumption. For example, power gates may be used to turn off memory periphery items in a deep sleep mode, and both the periphery items and the memory array in a shut down mode.

DETAILED DESCRIPTION

Figure 1:
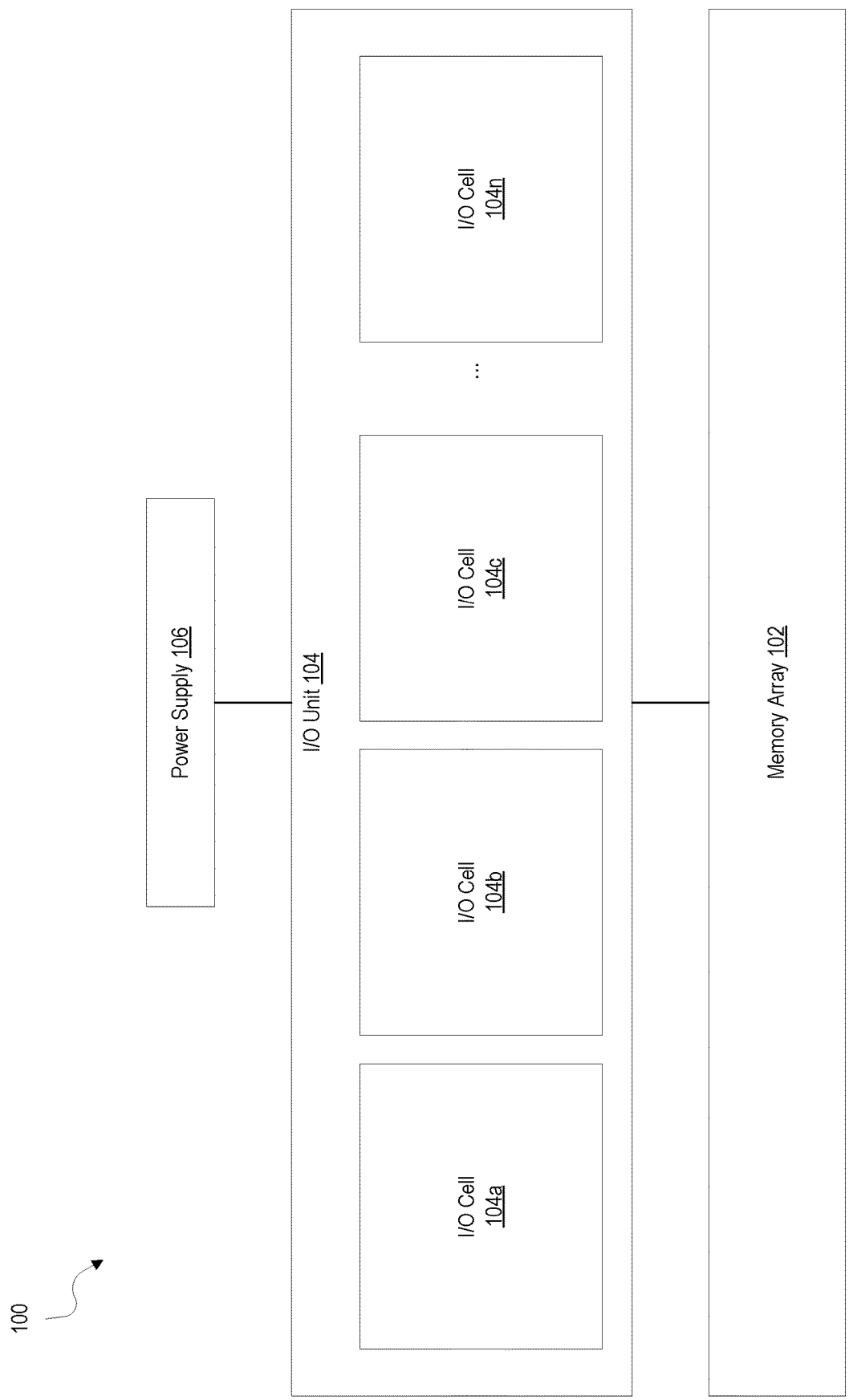
FIG. 1 is a block diagram illustrating an example memory device 100, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory architectures, such as static random-access memory (SRAM) devices, have two power management modes. In a shut-down mode, the memory array of the memory device (where information is stored), as well as circuits peripheral to the memory array, are turned off to conserve power. In situations where it is necessary to maintain data stored by the memory device, a deep sleep power management mode may be used, where power is conserved while maintaining stored information. In a deep sleep mode, power to the memory array is maintained, while devices or circuits peripheral to the memory such as input/output (TO) circuits and other control circuits are turned off.

Power gates are used to turn off the peripheral devices during the deep sleep mode, and are also used to turn off both the periphery and memory array during the shut-down mode. When the memory comes out of the shut-down mode, the power gates are used to ramp up internal supply voltages of the memory device, which can result in a large wake up inrush current.

Power gating is an integrated circuit design technique to reduce power consumption by shutting off the current to blocks of a circuit that is not in use. Typically, power gating can be implemented using low-leakage PMOS transistors as header switches to shut off power supplies to parts of a design in standby or sleep mode. In other examples, NMOS footer switches can also be used as sleep transistors. Power gating helps reduce standby or leakage power. However, power gating may affect the architecture design and may cause increases in area due to metal tracks used for routing.

In some examples, a SRAM memory device includes a plurality of power domains that are used to reduce power consumption. However, traditionally, different power domains need to be woken-up by different sequential paths to reduce peak current. The separate pathways lead to design complexities caused by increases in area and metal track routing.

In some examples, the disclosed solution includes inserting a switch, such as a pass-gate PMOS device across the different power domains to achieve the same sequential wake-up path for the circuit blocks connected to different power domains for peak current reduction.

FIG. 1 is a block diagram illustrating an example memory device 100, in accordance with some embodiments. The memory device 100 can be a random-access memory, such as a static random-access memory (SRAM) device or another type of memory device such as a dynamic random-access memory (DRAM) device. As shown in FIG. 1, the memory device 100 includes, among other circuits, at least one memory array 102, and an input/output unit 104 (IO unit), including a plurality of I/O cells 104*a*, 104*b*, 104*c*, . . . 104*n*. The input/output unit 104 may be powered using a power supply 106, which may be referred to as VDD hereinafter.

The memory array 102 may include a plurality of memory cells (also referred to as bitcells) arranged in a matrix of rows and columns. Each of the memory cells of the memory array 102 is operative to store one bit of information. For example, in some SRAM implementations, each memory cell uses six transistors connected between an upper reference potential and a lower reference potential (typically ground) such that one of two storage nodes can be occupied by the information to be stored, with the complementary information stored at the other storage node. Other memory cell arrangements are within the scope of the disclosure.

The memory array 102 may include a plurality of word lines and a plurality of bit line pairs. Each memory cell of the memory array 102 may be connected to a word line and a bit line pair. A word line is operative to activate access to the memory cells of a row connected to the word line. The bit line pair is used to access information stored or to be stored in the memory cells activated by the word line. Although the memory device 100 is shown to include only one memory array 102 for ease of discussion, the memory device 100 could include a plurality of memory arrays 102.

The IO unit 104 controls the flow of data, address and control signals into and out of the memory array 102. In some examples, the IO unit 104 includes a plurality of IO cells that may each be configured to connect to a plurality of peripheral circuits that may be biased using different power domains. The peripheral circuits may include circuits that provide various functions of the memory device 100 associated with the memory array 102. An example of a peripheral circuit may include word line drivers. Other types of peripheral circuits are also be possible.

In some examples, subsets of the plurality of peripheral circuits may need to be powered off and woken-up at different times or with different power levels during the operation of the memory array 102. Therefore, subsets of the peripheral circuits that require similar biasing are connected to the same power domain. Typically, a memory device 100 includes a plurality of peripheral circuits that require multiple power domains wherein a subset of the plurality of peripheral circuits may be powered using one power domain, whereas another subset of peripheral circuits may be powered using a different power domain.

Figure 2:
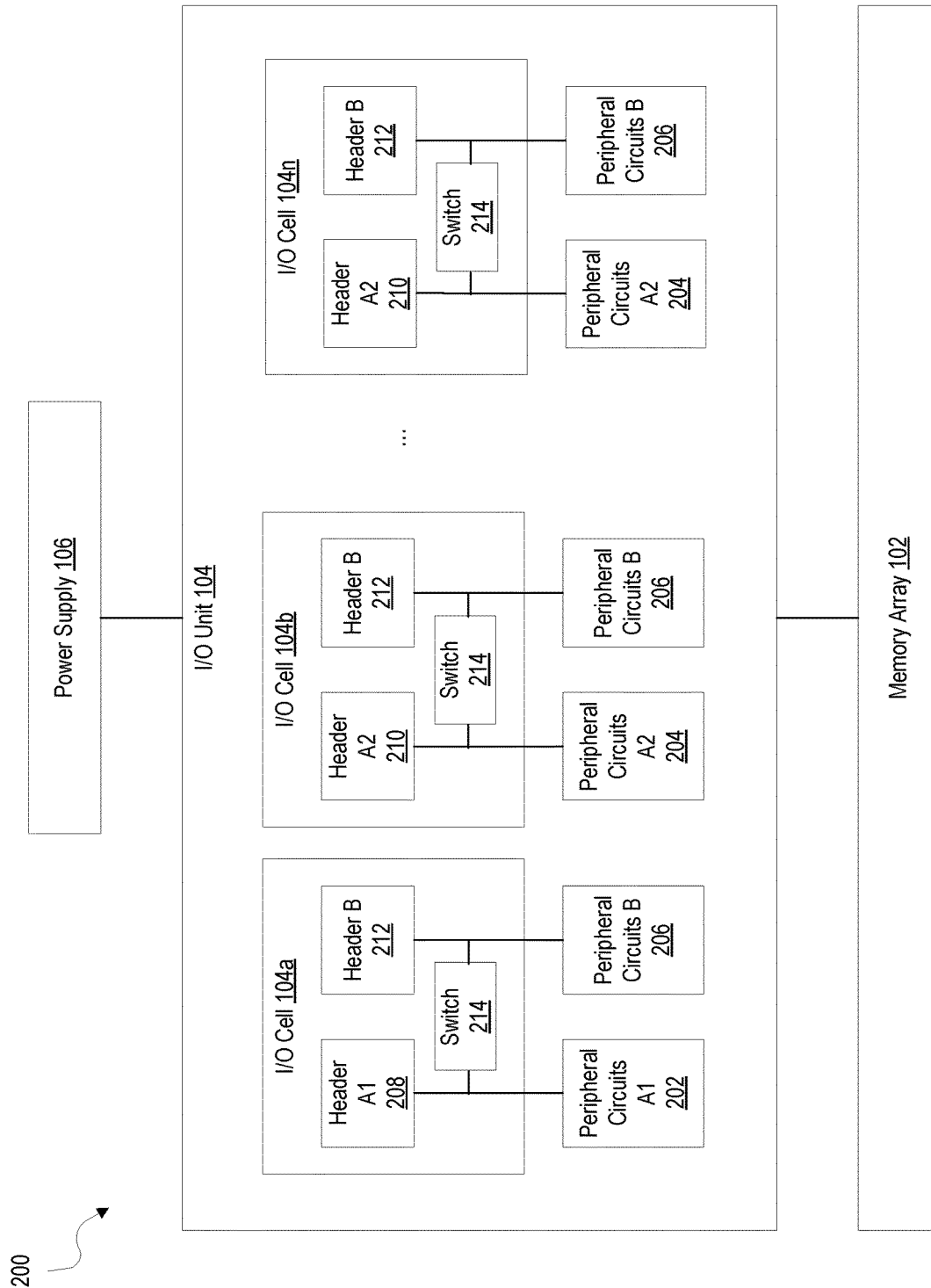
FIG. 2 illustrates a block diagram of an example memory device 200 including circuitry to reduce wake-up mode peak current.

FIG. 2 illustrates a block diagram of an example memory device 200 including circuitry to reduce wake-up mode peak current. In some examples, each I/O cell (104a, 104b, . . . 104n) included within the I/O unit 104 is configured to be connected to a plurality of subsets of peripheral circuits including peripheral circuits A1 202, peripheral circuits A2 204 and peripheral circuits B 206. Although only three different subsets of peripheral circuits are disclosed in the example 200, a plurality of other subsets of peripheral circuits are also possible. Each subset of peripheral circuitry can be powered by a corresponding power domain. For example, peripheral circuits A1 202 may be powered using power domain A1, peripheral circuits A2 204 may be powered using power domain A2, peripheral circuits B 206 may be powered using power domain B, etc.

In some examples, memory device 200 may include different power management modes including a shut-down mode, a sleep mode and a wake-up mode. In a shut-down mode, the memory array 102, as well as circuits peripheral (202, 204, 206) to the memory array 102, are turned off to conserve power. However, during the operation of the memory array 102, different peripheral circuits (202, 204, 206) may need to be switched to wake-up mode at different times.

In some examples, memory power management modes may use a header circuit 208, including header A1 208, header A2 210 and header B 212, to save power-off current from different power domains. For example, a low-leakage PMOS transistor may be implemented as a header switch to turn on and shut off different power domains that control different peripheral circuits 202, 204, 206 as needed. Other ways of implementing a header circuit 208 is also possible.

In some examples, when a power domain that is used to power a large number of peripheral circuits, such as power domain B that powers the peripheral circuits B 206 is switched from sleep mode to wake up mode, the peak wake-up current may be large as all peripheral circuit B 206 are turned on at the same time. One disclosed solution of inserting a wake-up path switch device 214 across the different power domains to achieve the same sequential wake-up path reduces the peak wake up current by gradually turning on portions of the peripheral circuits B 206 rather than turning them on at once. In the disclosed example, the wake-up path switch device 214 may be a pass-gate PMOS device. Other implementations of the wake-up path switch device 214 are also possible.

Without the disclosed solution of including a wake-up path switch device 214, peripheral circuits A1 202 may be switched to wake-up mode by turning header A1 208 on, peripheral circuits A2 204 may be switched to wake-up mode by turning header A2 210 on, and peripheral circuits B 206 may be switched to wake-up mode by turning header B 212 on. When a particular subset of peripheral circuits is widely implemented within the memory device 200 (such as peripheral circuit B 206 in the disclosed example), turning on the header circuit (header B 212 in the disclosed example) that controls that particular subset of peripheral circuits (peripheral circuit B 206) results in a sudden spike of current. However, if a subset of the peripheral circuits B 206 are switched to wake up mode, then the peak wake-up current may be reduced.

One method of reducing peak wake-up current may include having subsets of peripheral circuit B 206 connected to separate power domains and using control logic to time delay switching subsets of peripheral circuit B 206 to wake-up mode. However, such an implementation may require additional metal routing and implementing additional control logic that may ultimately result in increased area and power consumption. The disclosed example of implementing a wake-up path switch device 214 across different power domains may allow for a subset of the peripheral circuit B 206 to be switched to wake up mode when a different power domain, such as power domain A1 or power domain A2 are switched to the wake up mode. The implementation and function of the wake-up mode switch device 214 is further described in relation to FIG. 3.

Figure 3:
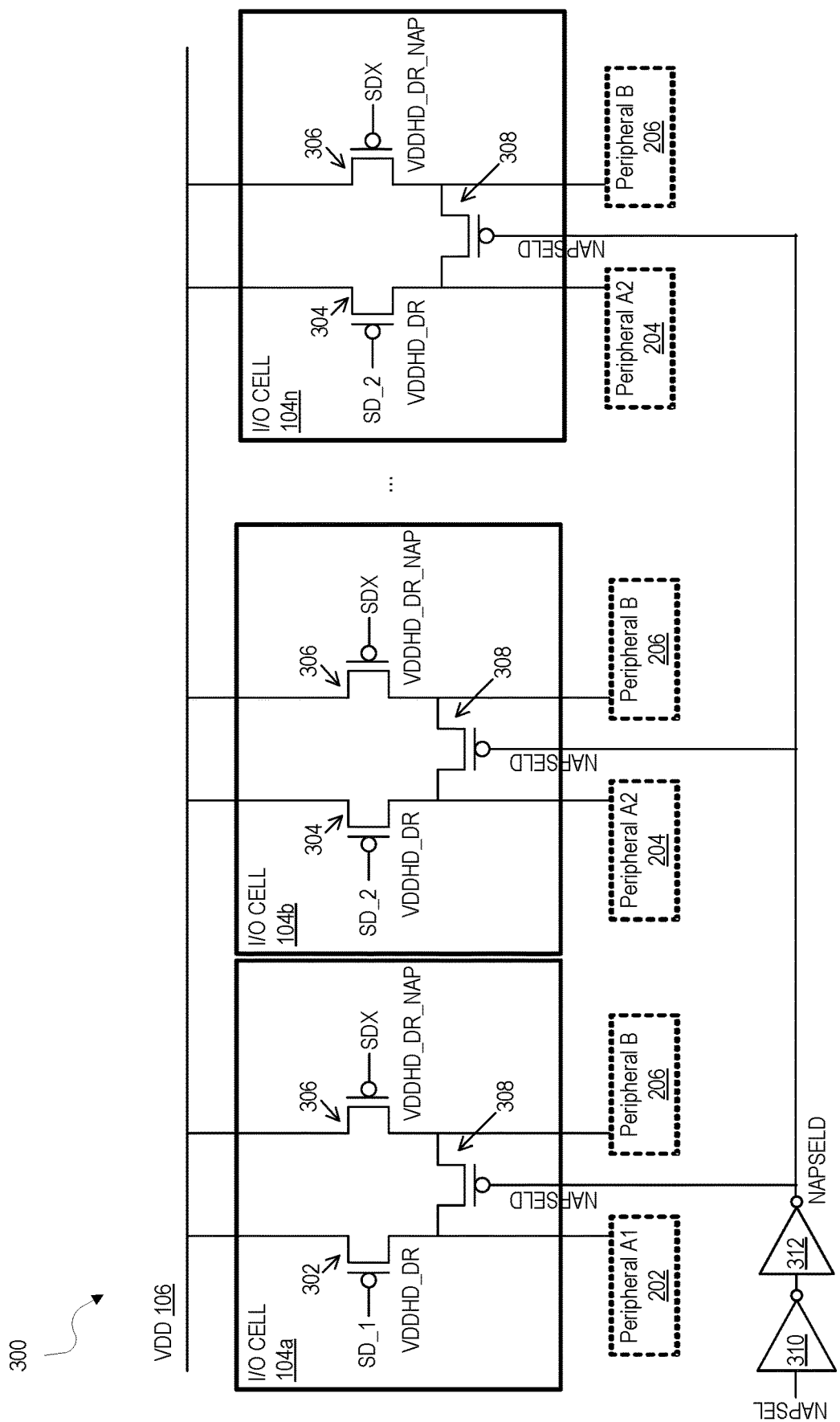
FIG. 3 is an example circuit diagram 300 illustrating an implementation of the wake-up paths for memory on different power domains according to some embodiments.

FIG. 3 is an example circuit diagram 300 illustrating an implementation of the wake-up paths for memory on different power domains according to some embodiments. In the disclosed circuit diagram 300, each of the IO cells 104a, 104b, . . . 104n are connected to the VDD power supply 106, which may be used to configure the power domains VDDHD_DR and VDDHD_DR_NAP. Although only two power domains are disclosed in relation to FIG. 3, other power domains are also possible.

In some examples, the IO cell 104a includes a header circuit 302 that can be switched on to configure the power domain VDDHD_DR and a header circuit 306 that can be switched on to configure the power domain VDDHD_DR_NAP. In some examples, the IO cell 104b includes a header circuit 304 that can also be switched on to configure the power domain VDDHD_DR and a header circuit 306 that can be switched on to configure the power domain VDDHD_DR_NAP. The header circuits 302, 304 and 306 can be implemented using a PMOS transistor.

For example, in the disclosed implementation, the PMOS transistor 302 may be configured with the source terminal connected to the VDD power supply 106, and the gate terminal connected to a SD_1 signal. Upon biasing the PMOS transistor 302 such that the SD_1 signal is pulled low, the PMOS transistor 302 may be turned on and the drain terminal of the PMOS transistor 302 is configured to be the VDDHD_DR power domain that is connected to the peripheral circuits A1 202. The PMOS transistor 306 may be be configured with the source terminal connected to the VDD power supply 106, the gate terminal connected to an SDX signal. Upon biasing the PMOS transistor 306 such that the SD signal is pulled low, the PMOS transistor 306 may be turned on and the drain terminal of the PMOS transistor 306 is configured to be the VDDHD_DR_NAP power domain that is connected to the peripheral circuit B 206. Similarly, in the disclosed implementation of IO cell 104b, PMOS transistors 304 and 306 may be connected in a similar manner to with an SD_2 signal biasing the PMOS transistor 304 and the SDX signal biasing the PMOS transistor 306 to configure the peripheral circuits A2 204 and peripheral circuits B 206 respectively.

In some examples, each IO cell 104 is configured to connected to peripheral circuits B 206 such that turning all the peripheral circuits B 206 at the same time may result in a large spike in VDD current. As described in relation to FIG. 2, to reduce the peak wake-up current, a wake-up path switch device 214 may be implemented to gradually wake-up subsets of the peripheral circuits B 206 instead of waking up all the peripheral circuits B 206 at once.

In some examples, the wake-up path switch device 214 may be implemented using a pass-gate PMOS device 308. For example, the source terminal of the pass-gate PMOS device 308 may be connected to the drain terminal of the PMOS transistor 302 or 304 that may be configured to deliver the VDDHD_DR power domain. The drain terminal of the pass-gate PMOS device 308 may be connected to the drain terminal of the PMOS transistor 306 that may be configured to deliver the VDDHD_DR_NAP power domain. A NAPSEL signal may be connected to the input of an inverter pair 310, 312 and the output of the inverter pair, NAPSELD is connected to the gate terminal of the pass-gate PMOS device 308 and configured to bias the pass-gate PMOS 308 to turn on or off depending on whether to enable the sequential wake-up path to the peripheral circuits B 206.

For example, initially when peripheral circuits 202, 204 and 206 are configured to be in a sleep mode, the PMOS transistors associated with the header circuits 302, 304 and 306 are set to a logic high value. Upon determining that the peripheral circuits A1 202 are to be switched to a wake-up mode, the header circuit 302 is turned on by biasing the SD_1 signal to be a logic low value. In response, the peripheral circuits A1 202 connected to power domain VDDHD_DR may be switched to the wake-up mode.

In the disclosed example, the peripheral circuits B 206 are configured to be switched to a wake-up mode at a time after the peripheral circuit A1 202 are configured to be in a wake-up mode. Therefore, the implemented pass-gate PMOS device 308 may be used to switch at least a subset of the peripheral circuits B 206 to a wake-up mode at the same time as the peripheral circuits A1 are configured to be in the wake-up mode. For example, the NAPSEL signal may be set to 0 or a logic low value and the corresponding NAPSELD signal is set to logic low signal. The NAPSELD signal, which is connected to the gate terminal of the pass-gate PMOS device 308, turns on the pass-gate PMOS device 308 such that the subset of peripheral circuits B 206 that are sequentially connected to the wake-up path of the peripheral circuit A1 202 may be switched to a wake-up mode even if the header circuit 306 is not turned on.

Similarly, another subset of the peripheral circuits B 206 can be switched to the wake-up mode by configuring the header circuit 304 to be turned on by biasing the SD_2 signal to a logic low value. In other examples where the memory device 200 includes additional peripheral circuits, other subsets of peripheral circuits B 206 may also be switched to a wake-up mode without biasing the header circuit 306 to turn on. Thus, when the header circuit 306 is configured to turn on by biasing the SDX signal to a logic low value, a subset of the peripheral circuits B 206 may already be operating in a wake-up mode and may not result in a sudden spike in current from all peripheral circuits B 206 switching to a wake-up mode at once without requiring additional metal routing or additional control logic.

Figure 4:
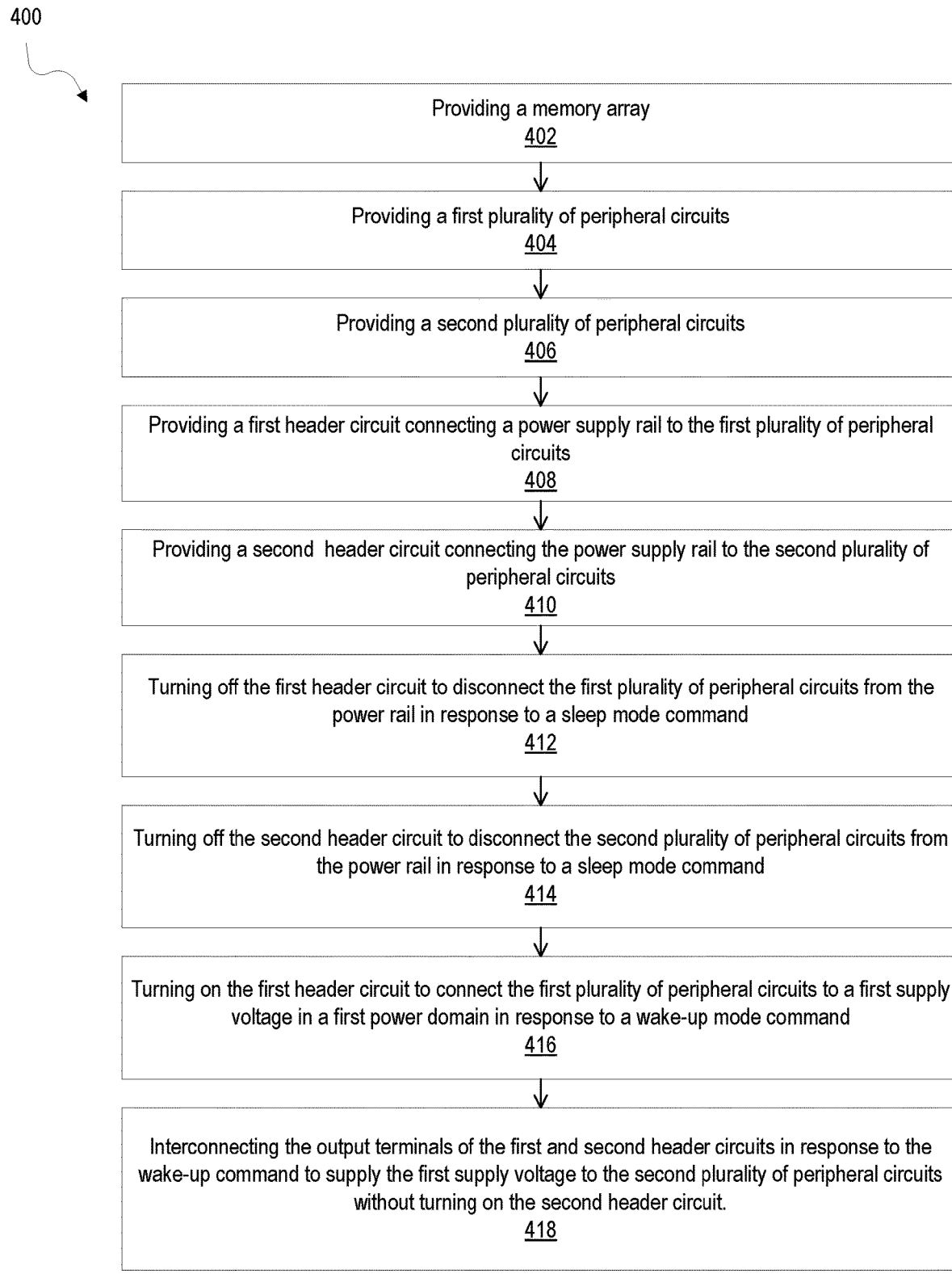
FIG. 4 is a flow diagram illustrating an example method for reducing peak current during wake-up mode.

FIG. 4 is a flow diagram illustrating an example method 400 for reducing peak current in a memory device during wake-up mode. For example, at a first operation shown in blocks 402-410, a memory device such as the memory device 200 is provided. In some examples, at operation 402, a memory array, such as memory array 102 is provided. In some examples, at operation 404, a first plurality of peripheral circuits, such as peripheral circuits A1 202, is provided. The first plurality of peripheral circuits is connected to the memory array 102 and configured to support the operation of the memory array 102. In some examples, at operation 406, a second plurality of peripheral circuits, such as peripheral circuits B 206, is provided. The second plurality of peripheral circuits is connected to the memory array 102 and also configured to support the operation of the memory array 102.

In some examples, at operation 408, a first header circuit, such as header circuit A1 208 is provided. The first header circuit includes at least two terminals, wherein one terminal is connected to a power supply rail, such as power supply 106 and the other terminal, which is the output terminal of the first header circuit, is connected to the first plurality of peripheral circuits. The first header circuit is configured to supply a power supply voltage to the first plurality of peripheral circuit in a first power domain.

In some examples, at operation 410, a second header circuit, such as header circuit B 212 is provided. The second header circuit includes at least two terminals, wherein one terminal is connected to a power supply rail, such as power supply 106 and the other terminal, which is the output terminal of the second header circuit, is connected to the second plurality of peripheral circuits. The second deader circuit is configured to supply a power supply voltage to the second plurality of peripheral circuits in a second power domain.

In some examples, at operation 412, in response to a sleep mode command, the first header circuit may be configured to disconnect the first plurality of peripheral circuits from the power supply rail. Similarly, at operation 414, in response to receiving a sleep mode command, the second header circuit may be configured to disconnect the second plurality of peripheral circuits from the power supply rail. For example, if the disclosed first and second header circuits from operations 412 and 414 are implemented using a PMOS transistor device (similar to the implementation described in FIG. 3 using PMOS transistor 302 and 306), the header circuits may be turned off by controlling the gate voltages of the PMOS transistors. When the gate voltage of the implemented PMOS transistor it turned to a logical high value, the PMOS transistor is turned off and the first and second plurality of peripheral circuits may be turned off. Other implementations are also possible.

In some examples, at operation 416, in response to a wake-up command, the first header circuit may be configured to connect the first plurality of peripheral circuits to the power supply rail. In some examples, the second header circuit may still be configured such that the second plurality of peripheral circuits may be disconnected from the power supply rail.

In some examples, at operation 418, further in response to a wake-up command, the output terminal of the first header circuit and the output terminal of the second header circuit may be interconnected with a switch device. Thus, selecting to turn on the switch interconnecting the output terminals of the first and second header device allows for the second plurality of peripheral circuits to be powered on without having to turn on the second header switch. In a memory device where the second plurality of peripheral circuits are widely implemented and controlled by a single control signal, the disclosed configuration allows for a subset of the second plurality of peripheral circuits to be turned on at a time. Not turning on all of the implemented second plurality of peripheral circuits at once reduces the peak current experienced by the memory device.

The present disclosure thus includes embodiments of a power control system, including a power supply rail configured to receive a power supply voltage signal, a first header circuit connected to the power supply rail and having a first output terminal configured to provide a first output voltage signal in a first power domain, a second header circuit connected to the power supply rail and having a second output terminal configured to provide a second output voltage signal in a second power domain and a control switch connected between the first and second header circuits configured to selectively interconnect the first and second output terminals.

In accordance with further embodiments, a memory system includes an array of memory cells, a first plurality of peripheral circuits connected to the array of memory cells, a second plurality of peripheral circuits connected to the array of memory cells, a power supply rail configured to receive a power supply voltage signal, a first power control cell including and a second power control cell. The first power control cell includes a first header circuit connected to the power supply rail and having a first output terminal connected to the first plurality of peripheral circuits to provide a first output voltage signal in a first power domain and a second header circuit connected to the power supply rail and having a second output terminal connected to the second plurality of peripheral circuits to provide a second output voltage signal in a second power domain. The second power control cell includes a third header circuit connected to the power supply rail and having a third output terminal connected to a third plurality of peripheral circuits to provide a third output voltage signal in a third power domain and the second header circuit connected to the power supply rail and having the second output terminal connected to the second plurality of peripheral circuits to provide the second output voltage signal in a second power domain. The memory system further includes a first control switch connected between the first and second header circuits configured to selectively interconnect the first and second output terminals, and a second control switch connected between the second and third header circuits configured to selectively interconnect the second and third output terminals.

In accordance with still further embodiments, a method to reduce peak current in a memory device during wake-up mode includes providing a memory array, a first plurality of peripheral circuits connected to the memory array, a second plurality of peripheral circuits connected to the memory array, a first header circuit having a first output terminal, wherein the first header circuit is connected to a power supply rail and the first output terminal is connected to the first plurality of peripheral circuits, a second header circuit having a second output terminal, wherein the second header circuit is connected to the power supply rail and the second output terminal is connected to the second plurality of peripheral circuits. The memory device is operated by turning off the first header circuit to disconnect the first plurality of peripheral circuits from the power rail in response to a sleep mode command and turning off the second header circuit to disconnect the second plurality of peripheral circuits from the power rail in response to the sleep mode command. The memory device is further operated by turning on the first header circuit to connect the first plurality of peripheral circuits to a first supply voltage in a first power domain in response to a wake-up mode command and interconnecting the output terminals of the first and second header circuits in response to the wake-up command to supply the first supply voltage to the second plurality of peripheral circuits without turning on the second header circuit.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory I/O system, comprising:
   a first header circuit configured to receive a power supply voltage signal and having a first output terminal configured to provide a first output voltage signal in a first power domain to a first plurality of peripheral circuits;
   a second header circuit configured to receive the power supply voltage signal and having a second output terminal configured to provide a second output voltage signal in a second power domain to a second plurality of peripheral circuits;
   a control switch connected between the first and second header circuits, wherein when switching from a sleep mode to a wake-up mode, the control switch is configured to selectively provide the first output voltage signal in the first power domain to at least a portion of the second plurality of peripheral circuits without turning on the second header circuit.

2. The memory I/O system of claim 1, wherein the second header circuit is configured to selectively turn on during a wake-up mode and turn off during a sleep mode.

3. The memory I/O system of claim 1, wherein the first header circuit includes a first MOSFET device; and wherein the second header circuit includes a second MOSFET device.

4. The memory I/O system of claim 3, wherein the first MOSFET device includes a first PMOS transistor having source, drain and gate terminals, wherein the gate terminal is configured to receive a first header control signal that is selectively controlled to turn the first header circuit on during a wake-up mode and turn the first header circuit off during a sleep mode.

5. The memory I/O system of claim 4, wherein the drain terminal of the first PMOS transistor is configured to be the first output terminal.

6. The memory I/O system of claim 3, wherein the second MOSFET device includes a second PMOS transistor having a source, drain and gate terminals, wherein the gate terminal is configured to receive a second header control signal that is selectively controlled to turn the second header circuit on during a wake-up mode and turn the second header circuit off during a sleep mode.

7. The memory I/O system of claim 6, wherein the drain terminal of the second PMOS transistor is configured to be the second output terminal.

8. The memory I/O system of claim 3, wherein the control switch includes a third MOSFET device having a source, drain and gate terminals, wherein the source terminal is connected to the first output terminal, the drain terminal is connected to the second output terminal and the gate terminal is configured to receive a switch control signal.

9. The memory I/O system of claim 8, wherein the switch control signal is configured to selectively cause the third MOSFET device to form an electrical connection between the first output signal and the second output signal or break the electrical connection between the first output signal and the second output signal.

10. The memory I/O system of claim 8, further comprising a switch control signal input circuit including an inverter pair having an input terminal configured to receive the switch control signal and an output terminal connected to the gate terminal of the third MOSFET device.

11. A power control system, comprising:
a first header circuit connected to a power supply rail and configured to selectively connect a first plurality of memory peripheral circuits to a first output voltage signal in a first power domain in a memory operation mode and disconnect the first plurality of memory peripheral circuits from the first output voltage signal in the first power domain in a sleep mode;
a second header circuit connected to the power supply rail and configured to selectively connect a second plurality of memory peripheral circuits to a second output voltage signal in a second power domain in the memory operation mode and disconnect the second plurality of memory peripheral circuits from the second output voltage signal in the second power domain in the sleep mode; and
a control switch connected between the first and second header circuits;
wherein when switching from the sleep mode to a wake-up mode, the control switch is configured to selectively provide the first output voltage signal in the first power domain to at least a portion of the second plurality of peripheral circuits without turning on the second header circuit.

12. The power control system of claim 11, wherein the first header circuit includes a first MOSFET device; and wherein the second header circuit includes a second MOSFET device.

13. The memory system of claim 12, wherein the first MOSFET device includes a PMOS transistor having source, drain and gate terminals, wherein the gate terminal is configured to receive a first header control signal that is selectively controlled to turn the first header circuit on during the wake-up mode and turn the first header circuit off during the sleep mode.

14. The memory system of claim 12, wherein the second MOSFET device includes a PMOS transistor having a source, drain and gate terminals, wherein the gate terminal is configured to receive a second header control signal that is selectively controlled to turn the second header circuit on during the wake-up mode and turn the second header circuit off during the sleep mode.

15. The memory system of claim 11, further comprising a memory array connected to the first and second plurality of peripheral circuits.

16. The memory system of claim 15, wherein the memory array is an SRAM memory array.

17. A method, comprising:
applying a power supply voltage signal to a first header circuit that is configured to output a first voltage signal in a first power domain to a first plurality of peripheral circuits in a memory operation mode and to disconnect the first voltage signal from the first plurality of peripheral circuits in a sleep mode;
applying the power supply voltage signal to a second header circuit that is configured to output a second voltage signal in a second power domain to a second plurality of peripheral circuits in the memory operation mode and to disconnect the second voltage signal from the second plurality of peripheral circuits in the sleep mode;
when switching from the sleep mode to a wake-up mode, selectively interconnecting output terminals of the first and second header circuits to provide the first voltage signal in the first power domain to at least a portion of the second plurality of peripheral circuits without turning on the second header circuit.

18. The method of claim 17, wherein interconnecting the output terminals of the first and second header circuits includes controlling a control switch connected between respective output terminals of the first and second header circuits.

19. The method of claim 17, wherein controlling the control switch connected between respective output terminals of the first and second header circuits includes applying a control signal to a gate terminal of a MOSFET device connected between the respective output terminals of the first and second header circuits.

20. The method of claim 17, further comprising an SRAM memory array connected to the first plurality of memory peripheral circuits and the second plurality of memory peripheral circuits.

* * * * *